United States Patent [19]
Marieb et al.

[11] Patent Number: 6,100,709
[45] Date of Patent: Aug. 8, 2000

[54] SILICON WAFER TESTING RIG AND A METHOD FOR TESTING A SILICON WAFER WHEREIN THE SILICON WAFER IS BENT INTO A DOME SHAPE

[75] Inventors: Thomas N. Marieb, San Francisco; Krishna Seshan, San Jose; Donald L. Scharfetter, Los Altos, all of Calif.

[73] Assignee: Intel Corporation, Santa Clara, Calif.

[21] Appl. No.: 09/087,753

[22] Filed: May 29, 1998

[51] Int. Cl.[7] .............................. G01B 7/28; G01R 15/12; G01R 31/02
[52] U.S. Cl. ........................ 324/765; 324/761; 324/758; 324/765; 702/95; 702/117; 702/82; 73/849; 73/853
[58] Field of Search ..................................... 324/761, 758; 702/95, 117, 82; 250/492.2; 73/849, 853

[56] References Cited

U.S. PATENT DOCUMENTS

| | | | |
|---|---|---|---|
| 4,700,077 | 10/1987 | Dykstra et al. | 250/492.2 |
| 4,750,141 | 6/1988 | Judell et al. | 702/95 |
| 5,489,854 | 2/1996 | Buck et al. | 324/761 |
| 5,530,374 | 6/1996 | Yamaguchi | 324/758 |
| 5,642,056 | 6/1997 | Nakajima et al. | 324/758 |

*Primary Examiner*—Ernest Karlsen
*Assistant Examiner*—Jimmy Nguyen
*Attorney, Agent, or Firm*—Blakely, Sokoloff, Taylor & Zafman LLP

[57] ABSTRACT

A wafer testing rig includes a stand, a first contact component, a second contact component and a biasing device. The first contact component is mounted to the stand. The second contact component is mounted to the stand for movement towards and away from the first contact component. The first and second contact components are shaped so that a wafer, when located between the contact components, is deflected into a dome shape when the second contact component is moved towards the first contact component. The biasing device is operable to move the second contact component towards and away from the first contact component. An electrical tester is provided to test the wafer.

18 Claims, 4 Drawing Sheets

SILICON WAFER TESTING RIG AND A METHOD FOR TESTING A SILICON WAFER WHEREIN THE SILICON WAFER IS BENT INTO A DOME SHAPE

BACKGROUND OF THE INVENTION

1). Field of the Invention

This invention relates to a silicon wafer testing rig, and to a method of testing an integrated circuit in a silicon wafer when the wafer is bent.

2). Discussion of Related Art

FIG. 1 of the accompanying drawings illustrates a conventional semiconductor package 10 which includes a package substrate 11 and an integrated circuit 12 which is mounted on the package substrate 11 by an array of solder balls 13. A circuit 14 is located in a surface of the semiconductor chip 12 facing the package substrate 11. Electrical leads (not shown) extend through the package substrate 11 and terminate at bond pads (not shown) on a surface of the package substrate 11 opposing the integrated circuit 12.

The semiconductor package 10 is mounted to a mother board or a card for a computer with the bond pads, referred to, making contact with the motherboard or the card.

FIG. 2 illustrates schematically a transistor 15 which typically exists in the circuit 14. The transistor 15 includes first and second spaced doped regions 16, and a gate 17. A voltage is applied over the doped regions 16. When a voltage is applied to the gate 17, electrons are caused to move between the doped regions 16.

The package substrate 11 is typically made of an organic material with a relatively high coefficient of thermal expansion and the semiconductor chip 12 is typically made of silicon with a relatively low coefficient of thermal expansion. In order to bond the solder balls 13 to the package substrate 11, the semiconductor package 10 is sent through a furnace at an elevated temperature so as to cause reflow of the solder balls 13. The semiconductor package 10 is then removed from the furnace. Once the semiconductor package 10 is removed from the furnace and the integrated circuit 12 and the package substrate 11 are allowed to cool to room temperature, the package substrate 11 tends to shrink more than the integrated circuit 12 due to its higher coefficient of thermal expansion. FIG. 3 illustrates in exaggerated detail how the package substrate 11 and the integrated circuit 12 deform due to differences in thermal expansion coefficients. Both the package substrate and the integrated circuit 12 are deformed into dome shapes. A surface of the integrated circuit 12 in which the integrated circuit 14 is located is thereby placed under compressive stress.

Stresses in the integrated circuit 14 have an effect on the electrical characteristics of the transistor 15. In particular, the movement of the electrons between the doped regions 16 increases or decreases when the transistor 15 is stressed due to changes in the carrier mobility of the material between the doped regions 16.

For proper chip design it is often necessary to know what kind of stresses exists in the integrated circuit and what the effects of these stresses are on the circuit 14. These stresses may be simulated by bending a wafer which contains an integrated circuit, and contacting the integrated circuit with a probe card. The probe card may be connected to an electrical tester. The electrical tester may then be used for testing characteristics of the integrated circuit in the bent wafer. The wafer may be bent into a channel shape which would cause stresses in the integrated circuit. However, as previously discussed, an integrated circuit tends to bend into a dome shape. By bending the wafer into a channel shape would therefore not accurately simulate the stresses within an integrated circuit.

SUMMARY

A wafer testing rig includes a stand, a first contact component, a second contact component and a biasing device. The first contact component is mounted to the stand. The second contact component is mounted to the stand for movement towards and away from the first contact component. The first and second contact components are shaped so that a wafer, when located between the contact components, is deflected into a dome shape when the second contact component is moved towards the first contact component. The biasing device is operable to move the second contact component towards and away from the first contact component. An electrical tester is provided to test the wafer.

BRIEF DESCRIPTION OF THE DRAWINGS

The invention is further described by way of example with reference to the accompanying drawings wherein.

DETAILED DESCRIPTION OF THE INVENTION

Figure 1:
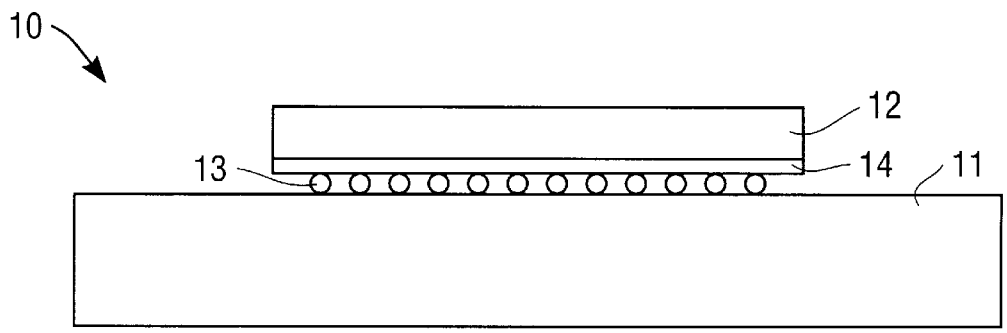
FIG. 1 is a side view of a conventional semiconductor package of the prior art including a package substrate and an integrated circuit.
Figure 2:
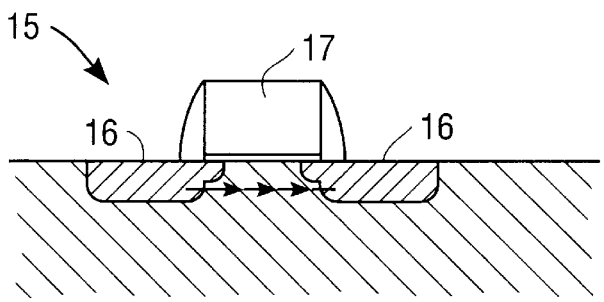
FIG. 2 is a cross-sectional view of a transistor in an integrated circuit in the integrated circuit of FIG. 1.
Figure 3:
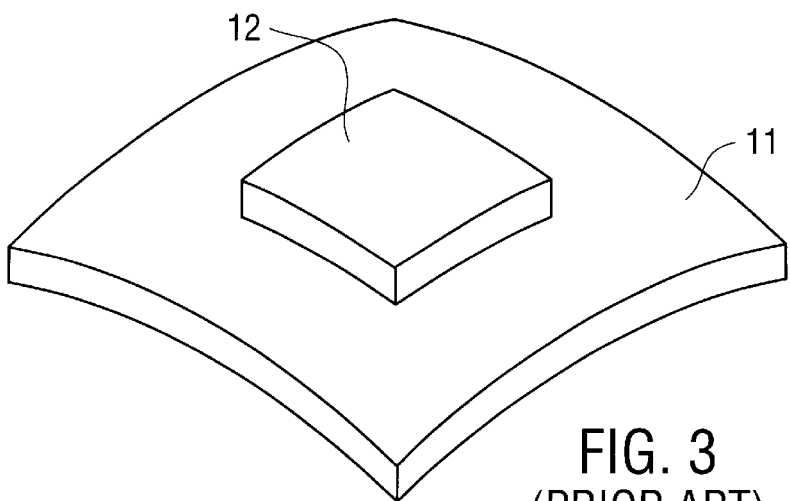
FIG. 3 is a perspective view which illustrates in exaggerated detail how the package substrate and the semiconductor chip of FIG. 1 bends due to temperature changes.
Figure 4:
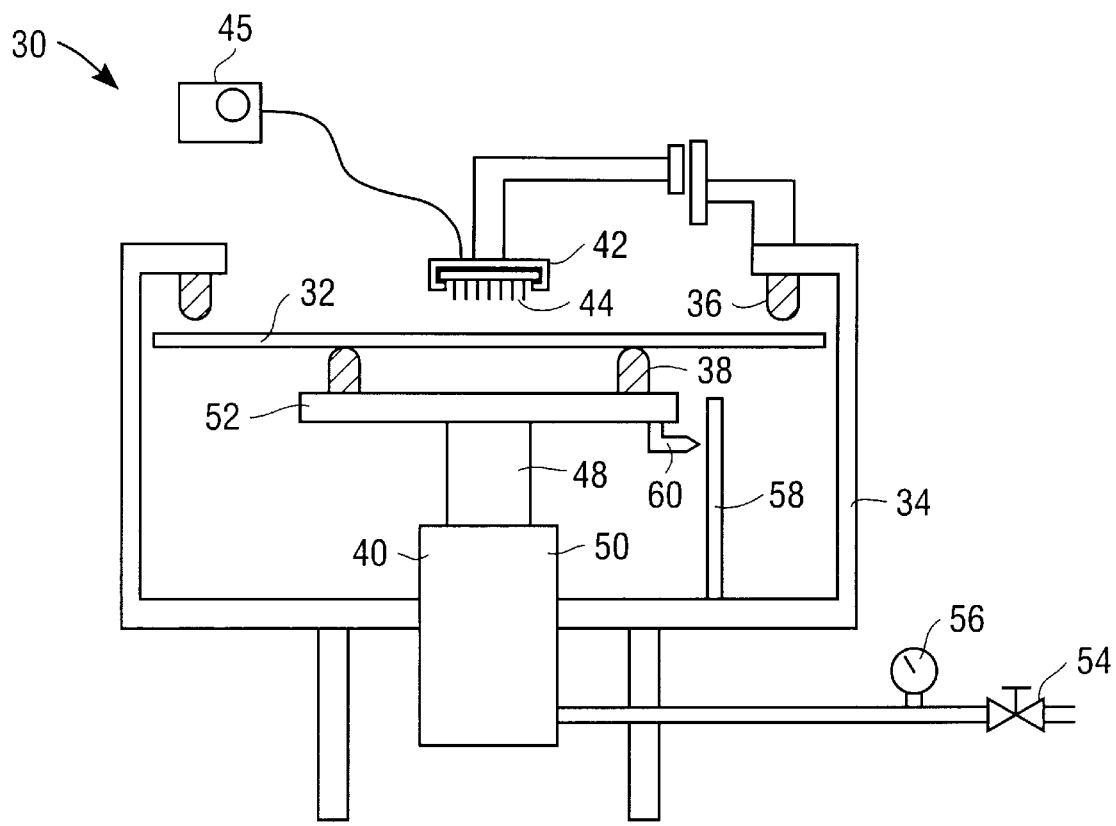
FIG. 4 is a side view of an embodiment of a silicon wafer testing rig, according to the invention, which is used for testing a silicon wafer.

FIG. 4 of the accompanying drawings illustrates a silicon wafer testing rig 30 which is used for bending a silicon wafer 32 and testing an integrated circuit in the wafer 32. The testing rig 30 includes a stand 34, a first contact component 36, a second contact component 38, a pressurized cylinder 40, a holder 42, a probe card 44, and an electrical tester 46.

The pressurized cylinder 40 is mounted to a lower portion of the stand 34 and has a piston 48 extending upwardly out of a cylinder portion 50 thereof. A plate 52 is located on the piston 48 and the second contact component 38 is mounted on the plate 52. The second contact component 38 is therefore mounted to the stand for movement in an up and down manner.

Figure 5:
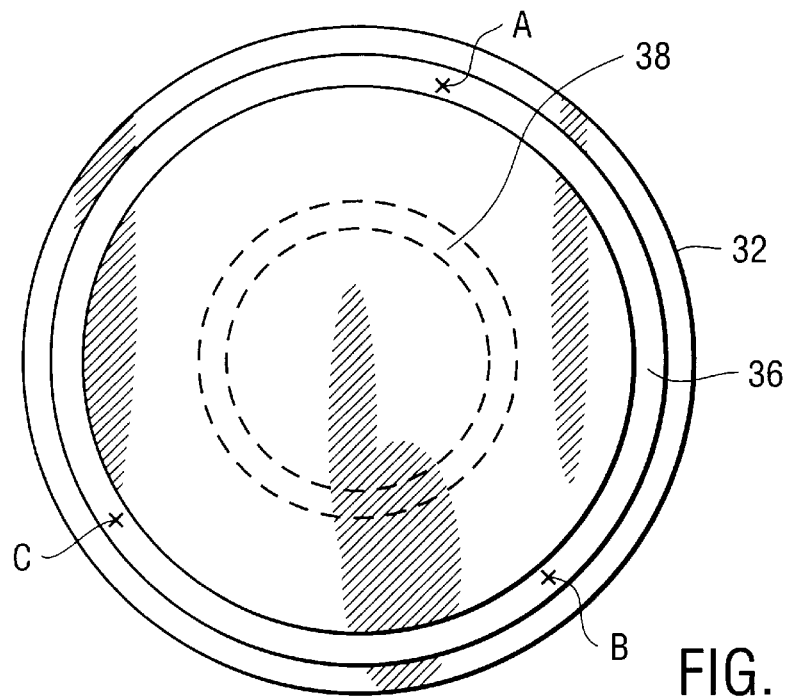
FIG. 5 is a plan view of the wafer and parts of the silicon wafer testing rig of FIG. 4.

Referring to FIG. 5, the second contact component 38 has a ring shape and supports the wafer 32 in a central portion of the wafer 32. The first contact component 36 also has a ring shape and is located substantially co-centrally with the second contact component 38 and above the wafer 32. The first contact component 38 has a diameter that is larger than the second contact component 36.

The pressurized cylinder 40 is connected to a source of high pressure through a valve 54. A pressure meter 56, or the like, provides an indication of pressure supplied to the pressurized cylinder 40. The indication is also indicative of a force exerted by the piston 48.

A linear scale 58 is mounted to the stand 34 and a marker 60 is mounted to the plate 52. Any movement of the plate 52, and therefore also the second contact component 38, will be reflected by the movement of the marker against the linear scale 58.

The probe card 44 is held captive by the holder 42 and is connected to the electrical tester 46. The holder 42 is adjustable relative to the stand 34 so as to move the probe card 44 into and out of contact with the wafer 32.

The testing rig 30 is used for bending the wafer 32 into a dome shape and for testing an integrated circuit on the wafer 32.

Figure 6A:
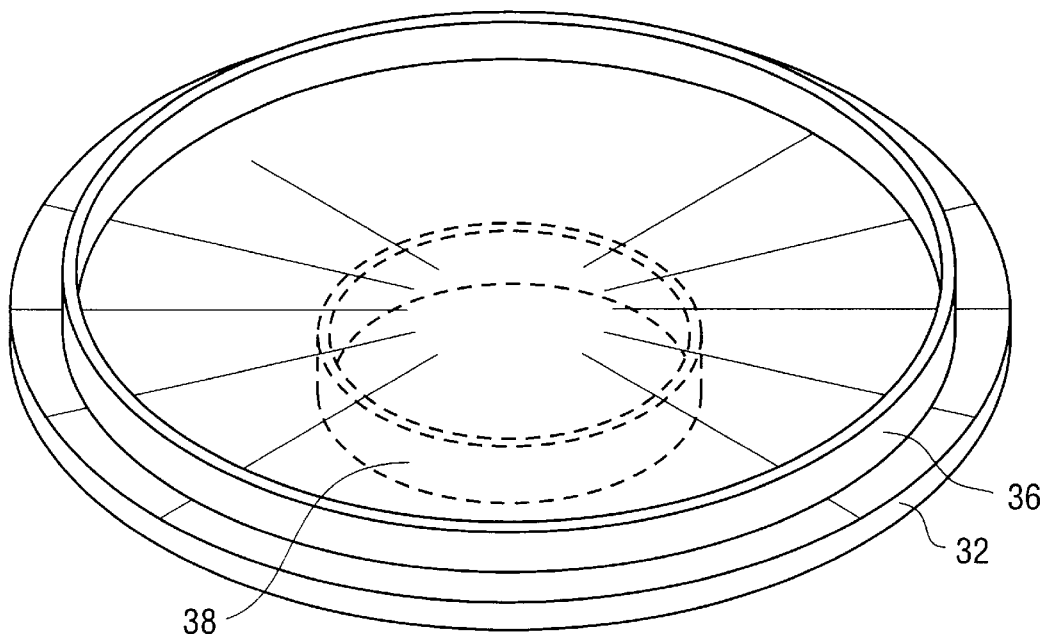
FIG. 6A is a perspective view illustrating the parts and the wafer of FIG. 5 before bending of the wafer.
Figure 6B:
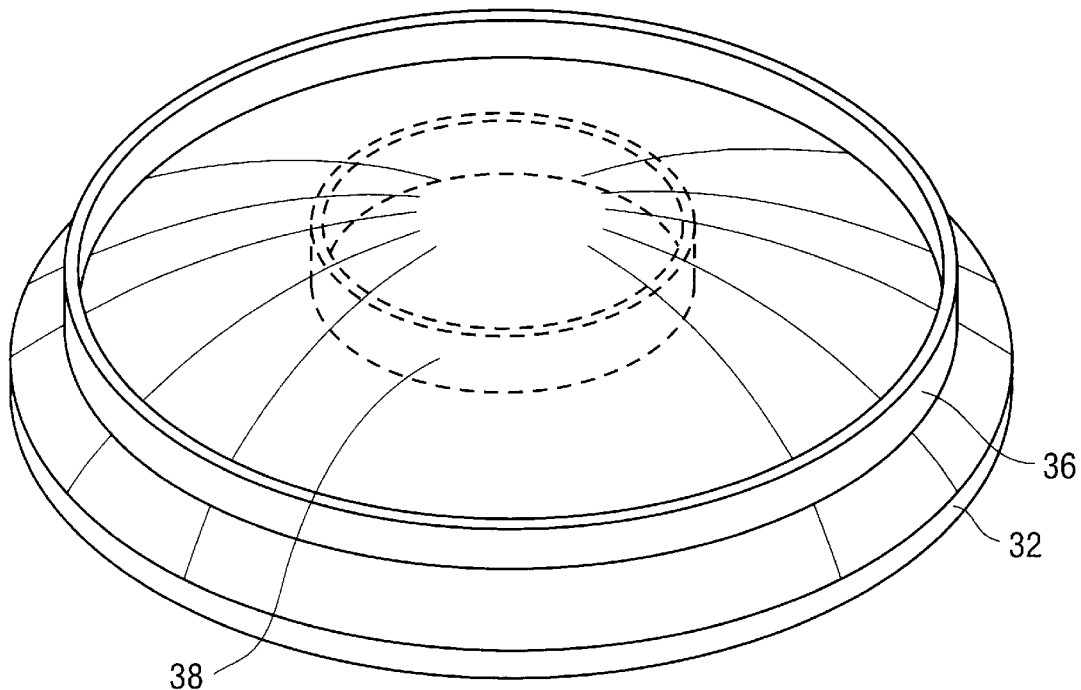
FIG. 6B is a view similar to FIG. 6A wherein the silicon wafer testing rig is used for bending the wafer.

An operator opens the valve 54 to allow a fluid to flow into the pressurized cylinder 40, thereby causing the piston 48 to move out of the cylinder portion 50. Movement of the piston 48 causes the second contact component 38 to move towards the first contact component 36 until the first contact component 36 contacts the wafer 32 as illustrated in FIG. 6A. Further movement of the second contact component 38 causes bending of the wafer 32 as illustrated in FIG. 6B. Since the first and second contact components, 36 and 38, both have circular donut shapes and the first contact component 36 is located around the second contact component 38, the wafer 34 is bent into a dome shape.

Figure 7:
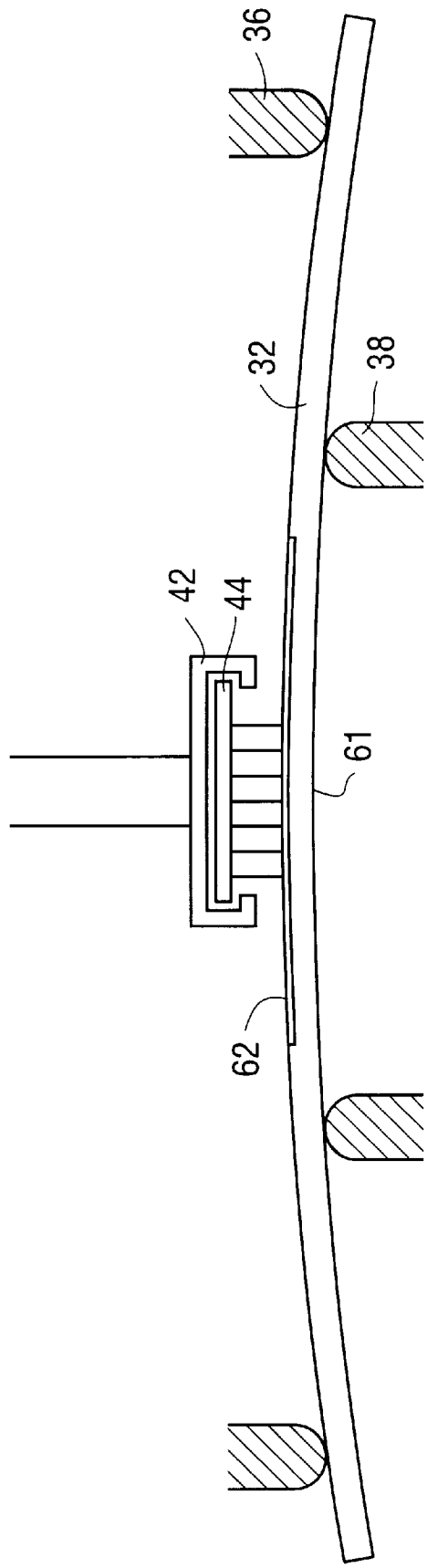
FIG. 7 is a side view of the parts and the wafer when the wafer is bent and a probe card is brought into contact with an integrated circuit on the wafer.

FIG. 7 is a side view illustrating the first contact component 36, the second contact component 38, the wafer 32 which is bent because of movement of the second contact component 38 towards the first contact component 36, and the holder 42 with the probe card 44. Because of the shapes and positioning of the first and second contact components 36 and 38, a portion 61 of the wafer 32 within the second contact component 38 may be bent into a sphere shape. An integrated circuit 62 is located in an upper surface of the portion 61 defining the sphere shape. By bending the portion 61 into a sphere the integrated circuit 62 is bi-axially stressed. The operator then moves the holder 42 so that the probe card 44 contacts the integrated circuit 62. The electrical tester 46 is now electrically connected to the integrated circuit 62. The electrical tester 46 is then used for testing one or more characteristics of a circuit in the integrated circuit 62.

While testing the integrated circuit 62 utilizing the electrical tester, the operator also takes a reading of the marker 60 on the linear scale 58. This reading is indicative of the deflection of the wafer 32. The operator also takes a reading from the pressure meter 56. This reading is indicative of the force that deflects the wafer 32. The readings from the pressure meter 56 and the linear scale 58 can be used for calculating stresses of the wafer 32 in the area of the integrated circuit 62. The characteristics measured by the electrical tester 46 can so be drawn as a function of the stresses in the integrated circuit.

As discussed in the preamble above, an integrated circuit which is located on a package substrate usually bends, due to temperature changes, into a dome shape. By bending the wafer 32 into a dome shape, a more accurate simulation of stresses in integrated circuits can be obtained as opposed, for example, to bending the wafer 32 merely into a channel shape.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

For example, referring to FIG. 5, it should be noted that the first contact component 36 contacts the wafer 32 at three locations A, B and C and that the second contact component 38 contacts the wafer 32 within a triangle defined by the three points A, B and C. A testing rig can therefore, alternatively, be designed so as to have a first contact component which contacts a wafer at three or more points and a second contact component which contacts the wafer on an opposing side in an area located within a triangle defined by the three points. Such a testing rig may also be able to bend a wafer into a dome shape.

Furthermore, the testing rig 30 bends the wafer 32 so that tensile stresses result within the integrated circuit. The testing rig has particular application for simulating stress conditions in a semiconductor chip having an integrated circuit which is placed in tensile stress. A testing rig may, alternatively, be designed which would place an integrated circuit in a wafer under compressive stress.

What is claimed:

1. A wafer testing rig which includes:

a stand;

first and second contact components mounted to the stand at spaced locations to allow for a wafer to be inserted between the contact components, the contact components being movable relatively to one another and having surfaces which contact the wafer and bend the wafer when the contact components are moved towards one another, the first contact component contacting the wafer at at least three different outer locations and the second contact component contacting the wafer at at least one inner location within a triangle defined by the three outer locations; and a device which is operable to move the contact components relatively to one another.

2. The wafer testing rig of claim 1 wherein the three outer locations are located on an outer ring shape.

3. The wafer testing rig of claim 1 wherein the outer ring shape is circular.

4. The wafer testing rig of claim 1 wherein the second contact component contacts the wafer at more than one inner location.

5. The wafer testing rig of claim 4 wherein the inner locations are located on an inner ring shape.

6. The wafer testing rig of claim 5 wherein the inner ring shape is circular.

7. A wafer testing rig which includes:

a stand;

a first contact component which is mounted to the stand;

a second contact component which is mounted to the stand for movement towards and away from the first contact component, the first and second contact components being shaped so that a wafer, when located between the contact components, is bent into a dome shape by the contact components when the second contact component is moved towards the first contact component;

a biasing device which is operable to move the second contact component towards and away from the first contact component; and an electrical tester which tests the wafer.

8. The wafer testing rig of claim 7 wherein at least a portion of the silicon wafer is bent into a sphere.

9. The wafer testing rig of claim 7 wherein at least one of the contact components has a ring surface contacting the wafer.

10. The wafer testing rig of claim 9 wherein the other contact component has a ring surface contacting the wafer.

11. The wafer testing rig of claim 10 wherein one of the contact components has a diameter which is larger than the other contact component.

12. The wafer testing rig of claim 7 wherein the biasing device is a pressurized cylinder.

13. The wafer testing rig of claim 7 which includes a measurement device which indicates a distance with which the wafer is bent.

14. The wafer testing rig of claim 7 which includes a gauge which provides a reading which is indicative of a force with which the wafer is bent.

15. The wafer testing rig of claim 7 wherein the electrical tester includes a holder which is mounted to the stand, capable of accepting a probe card, the holder being adjustable to move the probe card into electrical contact with an integrated circuit in the wafer.

16. A method of testing an integrated circuit in a wafer, including:

contacting the wafer on a first side thereof at at least three different outer locations with a first contact component;

contacting the wafer on a second side thereof, opposing the first side, at at least one inner location located within a triangle defined by the outer locations with a second contact component;

moving the contact components relatively towards one another to bend the wafer;

bringing a probing device into electrical contact with the integrated circuit; and relaying signals between the integrated circuit and an electrical tester with the probing device providing an electrical link between the integrated circuit and the electrical tester.

17. The method of claim 16 wherein the wafer is bent into a dome shape.

18. A method of testing an integrated circuit in a wafer, including:

bending the wafer into a dome shape; and testing a circuit in the wafer while the wafer has the dome shape.

* * * * *